United States Patent
Teterwak

(10) Patent No.: US 9,000,965 B2
(45) Date of Patent: Apr. 7, 2015

(54) CURRENT-STEERING DIGITAL-TO-ANALOG CONVERTER WITH CANCELLATION OF DYNAMIC DISTORTION

(71) Applicant: Maxim Integrated Products, Inc., San Jose, CA (US)

(72) Inventor: Jerzy Antoni Teterwak, Colorado Springs, CO (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/447,780

(22) Filed: Jul. 31, 2014

(65) Prior Publication Data

US 2014/0340251 A1    Nov. 20, 2014

Related U.S. Application Data

(63) Continuation of application No. 13/718,434, filed on Dec. 18, 2012, now Pat. No. 8,816,889.

(51) Int. Cl.
*H03M 1/66* (2006.01)
*H03M 1/06* (2006.01)

(52) U.S. Cl.
CPC .............. *H03M 1/0614* (2013.01); *H03M 1/66* (2013.01)

(58) Field of Classification Search
CPC .............................. H03M 1/0614; H03M 1/66
USPC .......... 341/144, 145, 122, 150, 118, 172, 120
See application file for complete search history.

(56) References Cited

U.S. PATENT DOCUMENTS

| | | | |
|---|---|---|---|
| 5,689,258 A | 11/1997 | Nakamura et al. | 341/136 |
| 7,098,829 B2 | 8/2006 | Westra | 341/144 |
| 7,443,219 B2 | 10/2008 | Rausch | 327/231 |
| 7,679,538 B2 | 3/2010 | Tsang | 341/144 |
| 8,350,741 B2 | 1/2013 | Steinbach | 341/144 |
| 2014/0167996 A1 | 6/2014 | Teterwak | 341/144 |

*Primary Examiner* — Peguy Jean Pierre

(57) ABSTRACT

A digital to analog converter includes a first switch, a second switch, and a driver module. The first switch includes a first differential pair of transistors connected to first inputs to receive digital data for conversion to analog data based on a clock signal output by a clock, and first outputs to output the analog data. The second switch includes second and third differential pairs of transistors connected to second inputs and the first outputs. The driver module drives one of the second inputs based on the digital data and toggles the second switch during a first cycle of the clock signal if the first switch is not toggled during the first cycle of the clock signal.

18 Claims, 5 Drawing Sheets

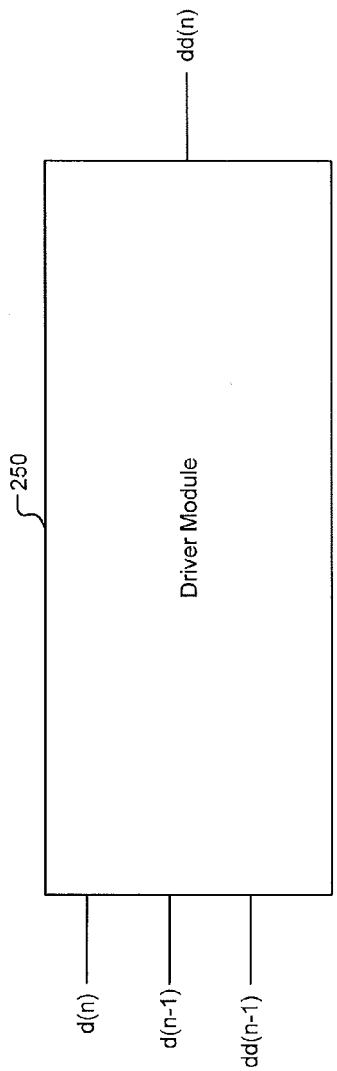
FIG. 4A
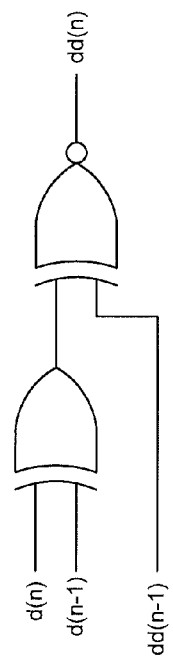
FIG. 4B
| d(n) | d(n-1) | dd(n-1) | dd(n) |
|---|---|---|---|
| 0 | 0 | 0 | 1 |
| 0 | 0 | 1 | 0 |
| 0 | 1 | 0 | 0 |
| 1 | 1 | 1 | 1 |
| 1 | 0 | 0 | 0 |
| 1 | 1 | 1 | 1 |
| 1 | 1 | 0 | 1 |
| 1 | 1 | 1 | 0 |
FIG. 4C

CURRENT-STEERING DIGITAL-TO-ANALOG CONVERTER WITH CANCELLATION OF DYNAMIC DISTORTION

CROSS-REFERENCE TO RELATED APPLICATIONS

This application is a continuation of U.S. patent Ser. No. 13/718,434, filed Dec. 18, 2012. The disclosure of the above application is incorporated herein by reference in its entirety.

FIELD

The present disclosure relates generally to digital-to-analog converters (DACs) and more particularly to high-speed, high dynamic performance current-steering DACs.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Digital-to-analog converters (DACs) are used to convert digital data into analog data. DACs are used in many applications including communication systems. A thermometer-coded DAC includes an equal current-source segment for each possible value of DAC output. For example, an 8-bit thermometer-coded DAC would have 255 segments, and a 16-bit thermometer-coded DAC would have 65,535 segments.

SUMMARY

A digital-to-analog converter (DAC) includes, in a segment of the DAC, a first switch and a second switch. The first switch includes a first pair of transistors having a first set of inputs and has a first output connected to an output of the DAC. The second switch includes second and third pairs of transistors having second and third sets of inputs, respectively, and has a second output that is connected to the output of the DAC. A driver module generates control signals to drive the first, second, and third sets of inputs based on data received by the DAC for conversion from digital to analog format at a conversion rate determined by a clock. The control signals toggle one of the first and second switches during each cycle of the clock.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 4A-4C depict a driver module that drives the main switch and the auxiliary switch in a segment of the DAC such that the main switch or the auxiliary switch is toggled in each clock cycle to cancel harmonic distortion in the DAC.

In the drawings, reference numbers may be reused to identify similar and/or identical elements.

DETAILED DESCRIPTION

In many communication systems, it is desirable that a digital-to-analog converter (DAC) produces signals with acceptable harmonic distortion. Producing signals with acceptable harmonic distortion is particularly desirable when the DAC is used in a communication system designed to meet specific requirements set forth in one or more communication standards. There are some effects in current-steering DACs that intrinsically limit dynamic performance. The present disclosure relates to DAC architecture that cancels dominant distortion effects in high-speed current steering DACs.

More specifically, the present disclosure relates to cancellation of dynamic distortion in high-speed DACs using a segment switch architecture that cancels transient effects responsible for generating third-order distortion. The architecture disclosed herein also results in constant switching activity in a DAC current switch array, which reduces distortion generated by voltage drops in DAC power supply network.

As used herein, constant switching activity in a segment means that switching occurs in a segment during each clock cycle irrespective of whether data requires toggling the switch in the segment. More specifically, as explained below in detail, in a segment, either the main switch or an auxiliary switch added according to the present disclosure is toggled in each clock cycle regardless of whether the data requires toggling the main switch.

Figure 1:
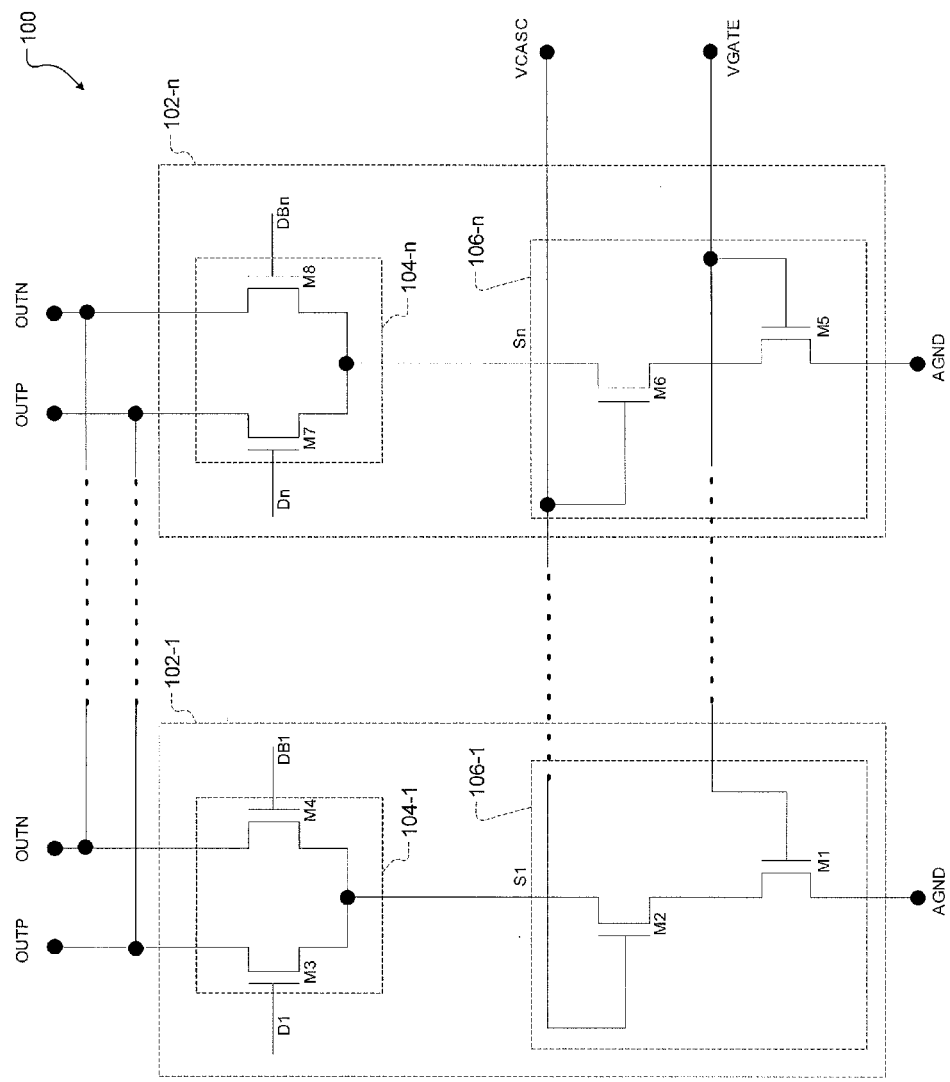
FIG. 1 is a schematic of a segmented current-steering digital-to-analog converter (DAC)

Referring now to FIG. 1, a current-steering DAC 100 is shown. The DAC 100 includes a plurality of differential segments 102-1, ..., and 102-n (collectively segments 102). Each segment 102 includes a pair of differential switches that steer an output of a current source to a negative or a positive output of the DAC 100. For example, the segment 102-1 includes a pair of differential switches 104-1 that steer an output of a current source 106-1 to the negative or the positive output of the DAC 100; and so on. The segment 102-n includes a pair of differential switches 104-n that steer an output of a current source 106-n to the negative or the positive output of the DAC 100. The pairs of differential switches 104-1, ..., and 104-n are collectively called switches 104. The current sources 106-1, ..., and 106-n are collectively called current sources 106. For example only, the transistors shown are NMOS transistors.

The switches 104 in the segments 102 are controlled by a binary-to-thermometer code decoder (not shown). As the input code increases, less current is directed to the negative output, and more current flows to the positive output. In most applications, the output signal is received in a differential mode. In the differential mode, the output current is equal to a difference between the current in the positive and negative converter output. The differential output configuration helps suppress even-order harmonics and increases output signal power.

In a fully segmented DAC, the number of segment switches is equal to $2^N-1$, where N is the converter resolution in bits. In practice, the number of main segments is usually limited to 32 or 64, and the desired (higher) resolution is achieved by adding segmented or binary-weighted sub-DACs.

One of the dynamic characteristics of a high-speed DAC is a Spurious Free Dynamic Range (SFDR) of the DAC. The SFDR is usually determined by a third-order distortion. The third-order distortion is also responsible for generating close-in intermodulation components, which should have low-level in many communications applications. Two dominant effects that inherently limit the third-order distortion performance of the DAC are related to variation of summing node potential of a switch and to an instantaneous drop in an output impedance of the switch.

Figure 2:
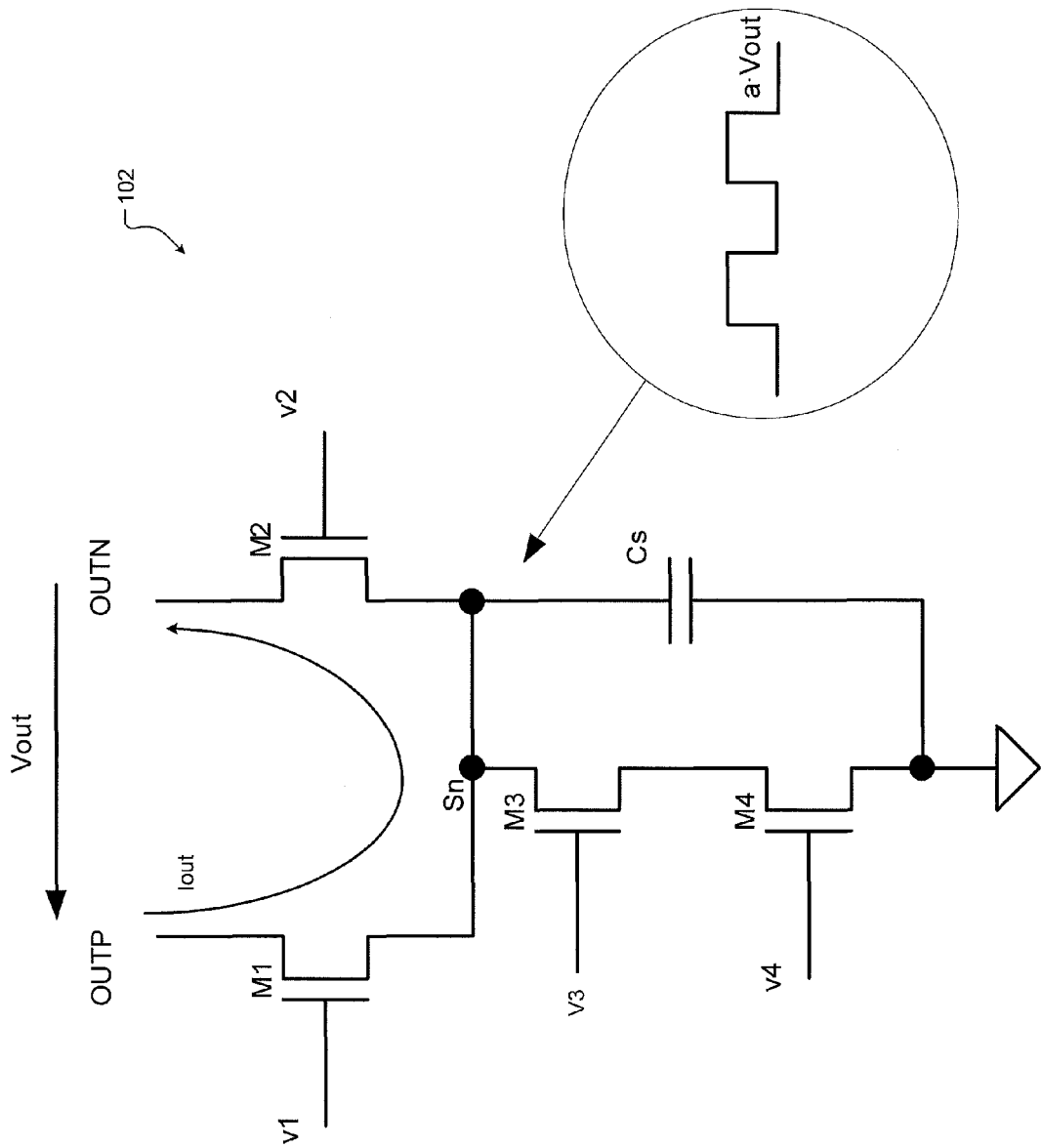
FIG. 2 depicts a segment of the DAC of FIG. 1.

Referring now to FIG. 2, the two effects are explained in detail. During a transition, a potential at node Sn shifts, a capacitance Cs is recharged, and current flowing through the capacitance Cs affects the DAC output. Also, during the transition, an output impedance of the switch drops instantaneously. Both these effects create an error current proportional to an absolute value of a derivative of the output signal of the DAC. The error current causes in third-order dynamic distortion.

The first effect, the variation of summing node potential of a switch 104, is caused by a finite intrinsic gain of transistors in the switch 104. When the switch 104 is toggled, the potential at node Sn shifts proportionally to a potential difference between the positive and the negative output of the DAC 100. The shift in potential at the node Sn causes the capacitance Cs at the node Sn to recharge. The charge flowing through the capacitance Cs affects the output current and depends on the signal. Thus, the shift in potential at the node Sn creates harmonic distortion.

The second effect is related to the fact that both transistors in a switch are active during the gate voltage transition causing the summing node Sn to become a low-impedance node. During that time, the output impedance of the switch, measured differentially, is equal to $2/g_{ds}$, where $g_{ds}$ is an output conductance of the transistors in the switch. The output impedance is much lower than when the transistors in the switch are fully switched. The output impedance of the fully switched transistor pair is determined by a cascode connection of transistors M1, M3 and M4. The output impedance of the fully switched transistor pair is significantly greater than $2/g_{ds}$.

While these two effects are different in nature, they affect the DAC operation in a similar way. They can be modeled by a variable conductance connected across the positive and the negative DAC output. The conductance is proportional to the segment switching activity, which implies that the conductance is also proportional to the absolute value of the derivative of the DAC output signal. This type of dependence on input data creates third-order harmonics in the DAC output spectrum, which are undesirable in some applications such as communication systems.

The two transient effects described above cause distortion because the switching activity is signal-dependent. More specifically, segment switching causes distortion because the switching activity is proportional to the absolute value of the derivative of the DAC output signal. If the segment switching activity were constant, and independent of the output signal, no distortion would be created. Accordingly, the distortion can be eliminated by making the switching activity constant and independent of the DAC output signal.

Figure 3:
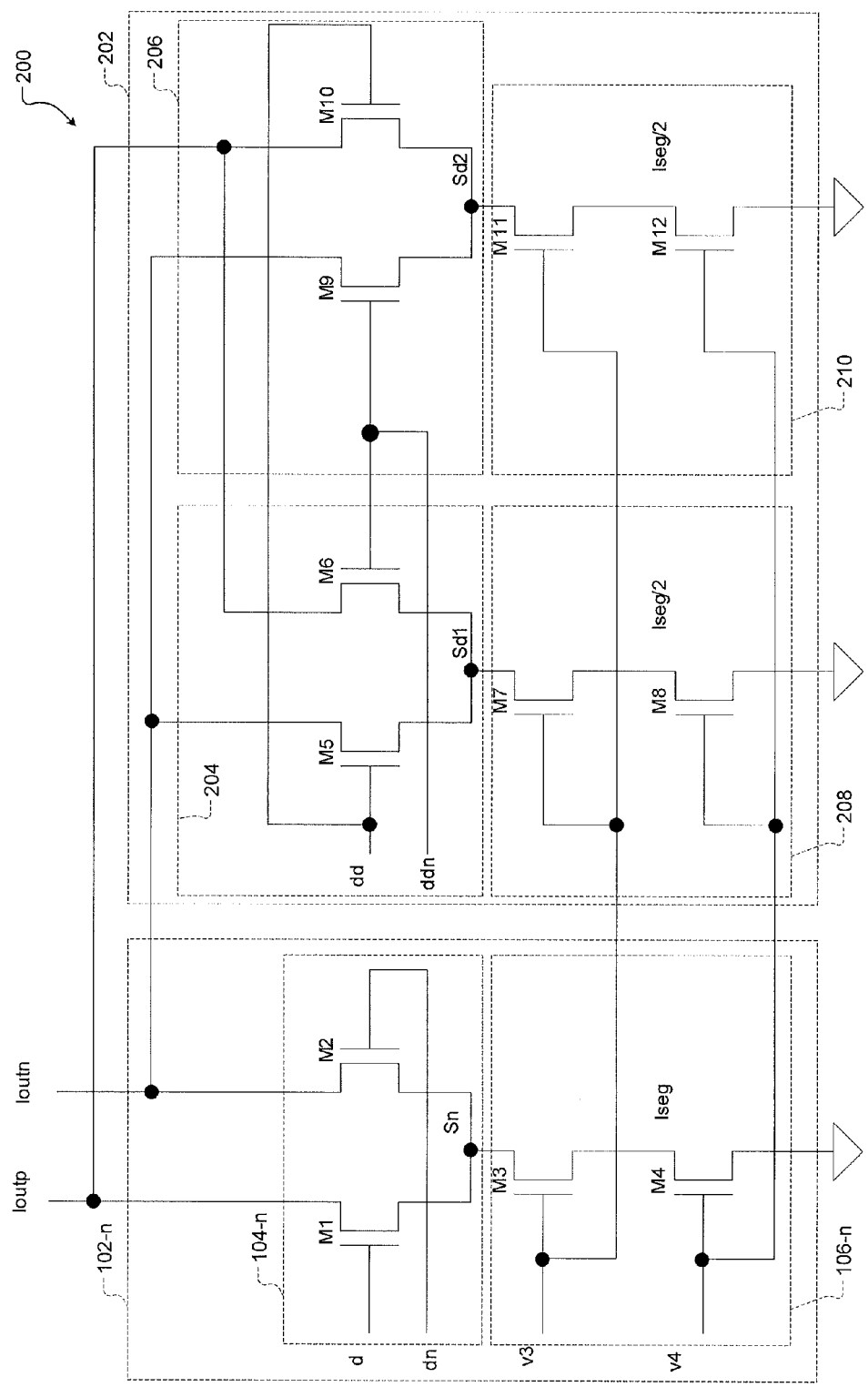
FIG. 3 is a schematic of a segment of a current-steering DAC that includes a main switch and an auxiliary switch in the segment, where the main switch or the auxiliary switch is toggled in each clock cycle to cancel harmonic distortion in the DAC.

Referring now to FIG. 3, a segment 200 of a DAC according to the present disclosure is shown. For clarity, only one segment is shown. Ideally, each segment of a DAC can be designed similar to the segment 200. In practice, only segments corresponding to higher-order bits (e.g., MSBs) can be designed similar to the segment 200 since the distortion created by segments corresponding to lower-order bits (e.g., LSBs) may be negligible.

The segment 200 makes the switching activity constant and independent of the DAC output signal as follows. The segment 200 includes a main switch 104-n and an auxiliary switch 202. The auxiliary switch 202 includes two differential pairs (i.e., a pair of differential switches) 204 and 206 respectively connected to current sources 208 and 210. Each of the switches 204 and 206 is half the size of the main switch 104-n. Each of the switches 204 and 206 conducts half of the segment current. The two differential pairs in the dummy switch are cross-connected in such a way that the DAC output current does not change when the auxiliary switch 202 is toggled.

The main switch 104-n and an auxiliary switch 202 are driven in such a way that in each clock cycle one and only one switch in the main-auxiliary pair is toggled. Specifically, in each clock cycle, the main switch 104-n is static (i.e., is not toggled) if the auxiliary switch 202 is toggled, and the auxiliary switch 202 is static (i.e., is not toggled) if the main switch 104-n is toggled.

The auxiliary switch 202 does not change the DAC output current. The auxiliary switch 202 creates exactly the same transient as the main switch 104-n. This results in the switching activity in the segment 200 being constant and independent of the output signal. As a result, no distortion is created. The constant switching activity also provides an added benefit of creating only signal independent voltage drops across the power supply network.

Referring now to FIGS. 4A and 4B, an example of a driver module 250 that can be used to drive the main switch 104-n and the auxiliary switch 202 such that in each clock cycle one and only one switch in the main-auxiliary pair is toggled is shown. A general driver module 250 is shown in FIG. 4A. An example of a specific implementation of the driver module 250 is shown in FIG. 4B. In FIGS. 4A and 4B, d(n) and dd(n) indicate states of inputs at nth clock cycle, and d(n−1) and dd(n−1) indicate states of the inputs at (n−1)th clock cycle. Accordingly, dd(n) is generated based on an XNOR of (i) dd(n−1) and (ii) an XOR of d(n) and d(n−1). FIG. 4C shows a truth-table for the driver module 250.

Figure 5:
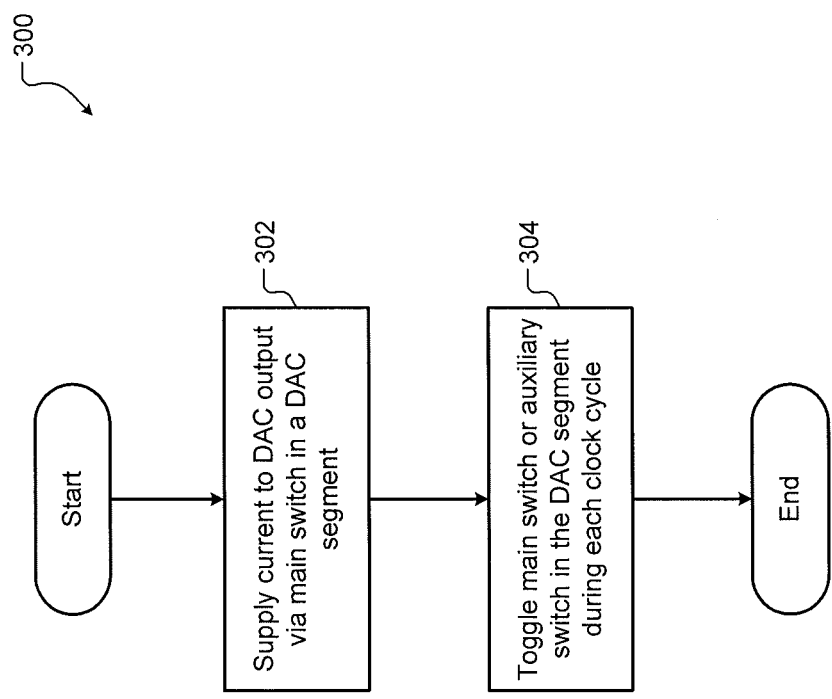
FIG. 5 is a flowchart of a method for canceling harmonic distortion in the DAC.

Referring now to FIG. 5, a method 300 for canceling harmonic distortion in a current-steering DAC is shown. While the method shown describes operation for only one segment of the DAC, the operation can be extended to any number of segments of the DAC. At 302, control operates a main switch in a segment of the DAC and supplies current to DAC output via the main switch. At 304, control toggles the main switch or an auxiliary switch in the segment during each clock cycle. The auxiliary switch creates the same transients as the main switch, which cancels the harmonic distortion in the DAC output without changing current supplied to the DAC output.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A digital to analog converter comprising:
a first switch including a first differential pair of transistors connected to first inputs to receive digital data for conversion to analog data based on a clock signal output by a clock, and first outputs to output the analog data;
a second switch including second and third differential pairs of transistors connected to second inputs and the first outputs; and
a driver module that drives one of the second inputs based on the digital data and that toggles the second switch during a first cycle of the clock signal if the first switch is not toggled during the first cycle of the clock signal.

2. The digital to analog converter of claim 1 wherein the driver module does not toggle the second switch during a second cycle of the clock signal if the first switch is toggled during the second cycle of the clock signal.

3. The digital to analog converter of claim 1 wherein the first switch or the second switch is toggled during each cycle of the clock signal irrespective of the data.

4. The digital to analog converter of claim 1 wherein the transistors of the second switch are of half the size of the transistors of the first switch.

5. The digital to analog converter of claim 1 further comprising first, second, and third current sources respectively connected to the first, second, and third differential pairs of transistors, wherein each of the second and third differential pairs of transistors conducts half the current conducted by the first differential pair of transistors.

6. The digital to analog converter of claim 1 wherein current through the first outputs is unchanged when the second switch is toggled.

7. The digital to analog converter of claim 1 wherein the driver module drives one of the second inputs based on a state of one of the first inputs during a current cycle of the clock signal and states of the one of the first inputs and the one of the second inputs during a preceding cycle of the clock signal.

8. The digital to analog converter of claim 1 wherein the second and third differential pairs of transistors are cross-connected.

9. The digital to analog converter of claim 1 wherein the first and second switches generate the same transients when the first and second switches are toggled.

10. A method comprising:
receiving digital data, for conversion to analog data based on a clock signal output by a clock, at first inputs of a first switch including a first differential pair of transistors connected to first outputs to output the analog data;
driving one of second inputs of a second switch including second and third differential pairs of transistors connected to the second inputs and the first outputs based on the digital data; and
toggling the second switch during a first cycle of the clock signal if the first switch is not toggled during the first cycle of the clock signal.

11. The method of claim 10 further comprising not toggling the second switch during a second cycle of the clock signal if the first switch is toggled during the second cycle of the clock signal.

12. The method of claim 10 further comprising toggling the first switch or the second switch during each cycle of the clock signal irrespective of the data.

13. The method of claim 10 wherein the transistors of the second switch are of half the size of the transistors of the first switch.

14. The method of claim 10 further comprising sourcing current from first, second, and third current sources respectively through the first, second, and third differential pairs of transistors, wherein each of the second and third differential pairs of transistors conducts half the current conducted by the first differential pair of transistors.

15. The method of claim 10 wherein current through the first outputs is unchanged when the second switch is toggled.

16. The method of claim 10 further comprising driving one of the second inputs based on a state of one of the first inputs during a current cycle of the clock signal and states of the one of the first inputs and the one of the second inputs during a preceding cycle of the clock signal.

17. The method of claim 10 further comprising cross-connecting the second and third differential pairs of transistors.

18. The method of claim 10 wherein the first and second switches generate the same transients when the first and second switches are toggled.

* * * * *